United States Patent
He et al.

(10) Patent No.: US 9,745,464 B2
(45) Date of Patent: Aug. 29, 2017

(54) HALOGEN-FREE FLAME RETARDANT RESIN COMPOSITION AND THE USE THEREOF

(71) Applicant: Shengyi Technology Co., Ltd., Guangdong (CN)

(72) Inventors: Yueshan He, Guangdong (CN); Shiguo Su, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 81 days.

(21) Appl. No.: 14/652,065

(22) PCT Filed: Feb. 7, 2013

(86) PCT No.: PCT/CN2013/071513
§ 371 (c)(1),
(2) Date: Jun. 12, 2015

(87) PCT Pub. No.: WO2014/089934
PCT Pub. Date: Jun. 19, 2014

(65) Prior Publication Data
US 2015/0307703 A1    Oct. 29, 2015

(30) Foreign Application Priority Data

Dec. 13, 2012 (CN) .......................... 2012 1 0541175

(51) Int. Cl.
| | | |
|---|---|---|
| C08L 63/00 | (2006.01) | |
| H05K 1/03 | (2006.01) | |
| C08L 71/00 | (2006.01) | |
| B32B 15/092 | (2006.01) | |
| C08J 5/24 | (2006.01) | |
| B32B 15/16 | (2006.01) | |
| B32B 27/20 | (2006.01) | |
| C08G 59/50 | (2006.01) | |
| C08G 59/62 | (2006.01) | |
| C08L 61/06 | (2006.01) | |
| H05K 3/02 | (2006.01) | |

(52) U.S. Cl.
CPC ............ *C08L 63/00* (2013.01); *B32B 15/092* (2013.01); *B32B 15/16* (2013.01); *B32B 27/20* (2013.01); *C08G 59/50* (2013.01); *C08G 59/621* (2013.01); *C08J 5/24* (2013.01); *C08L 71/00* (2013.01); *H05K 1/0353* (2013.01); *H05K 1/0373* (2013.01); *B32B 2260/025* (2013.01); *B32B 2260/046* (2013.01); *B32B 2264/102* (2013.01); *B32B 2264/104* (2013.01); *B32B 2307/306* (2013.01); *B32B 2457/08* (2013.01); *C08J 2361/06* (2013.01); *C08J 2363/00* (2013.01); *C08L 61/06* (2013.01); *H05K 1/0366* (2013.01); *H05K 3/022* (2013.01); *H05K 2201/012* (2013.01); *H05K 2201/0209* (2013.01)

(58) Field of Classification Search
CPC ...................... B32B 15/092; B32B 2307/306
See application file for complete search history.

(56) References Cited

U.S. PATENT DOCUMENTS

| | | | |
|---|---|---|---|
| 2003/0148107 | A1 | 8/2003 | Suzuki et al. |
| 2008/0090084 | A1* | 4/2008 | Cho .................. C09K 21/14 428/413 |
| 2011/0030439 | A1 | 2/2011 | Maier et al. |
| 2011/0045303 | A1* | 2/2011 | He .................. C08G 59/5073 428/418 |

FOREIGN PATENT DOCUMENTS

| | | |
|---|---|---|
| CN | 101643570 A | 2/2010 |
| CN | 101831144 A | 9/2010 |
| CN | 101851391 A | 10/2010 |
| CN | 102101935 | 6/2011 |
| EP | 2123712 A1 | 11/2009 |
| EP | 2290009 A1 | 3/2011 |
| EP | 2292696 A1 | 3/2011 |
| GB | 1451335 A | 9/1976 |
| KR | 20040066267 | 3/2006 |

OTHER PUBLICATIONS

ThreeBond Technical News, "Curing Agents for Epoxy Resins," Dec. 20, 1990.*
European Search Report for App. No. 13863595.8 (PCT/CN2013071513) dated Jun. 23, 2016.
English Abstract of CN101851391(A).
English Abstract of CN101643570(A).
International Search Report for PCT/CN2013/071513 mailed Oct. 3, 2013.
Tawainese Office Action for Application No. 102145421, dated Nov. 27, 2014.

* cited by examiner

*Primary Examiner* — Ian Rummel
(74) *Attorney, Agent, or Firm* — McDonald Hopkins LLC

(57) ABSTRACT

The present invention relates to a halogen-free flame retardant resin composition, according to parts by weight, the resin composition comprises: (A) a mixture of phenoxyphosphazene compound (A1) and compound (A2) having a dihydrobenzoxazine ring, the mixture comprising 45-90 parts by weight, and the weight ratio of the phenoxyphosphazene compound (A1) and the compound (A2) having a dihydrobenzoxazine ring is between 1:25-1:2; (B) an epoxy resin with epoxy equivalent of 500-2000, the epoxy resin comprising 10-45 parts by weight; (C) a phenolic resin comprising 10-25 parts by weight; and (D) an amine curing agent comprising 0.5-10 parts by weight. The prepreg, laminate, and metal-clad laminate for the printed circuit prepared using the halogen-free flame retardant resin composition, have the advantages of high glass transition temperature ($T_g$), high thermal resistance, low dielectric dissipation factor, low water absorption as well as a low C.T.E.

20 Claims, No Drawings

HALOGEN-FREE FLAME RETARDANT RESIN COMPOSITION AND THE USE THEREOF

CROSS-REFERENCE TO RELATED APPLICATION

This application is a national phase of PCT Application No. PCT/CN2013/071513 entitled, "A HALOGEN-FREE FLAME RETARDANT RESIN COMPOSITION AND THE USE THEREOF," filed on Feb. 7, 2013, which claims priority to Chinese Patent Application No. 201210541175.4 entitled, "A HALOGEN-FREE FLAME RETARDANT RESIN COMPOSITION AND THE USE THEREOF," filed on Dec. 13, 2012, both of which are hereby incorporated by reference in their entirety.

TECHNICAL FIELD

The present invention relates to a halogen-free flame retardant resin composition and the use thereof, in particular, the present invention relates to a halogen-free flame retardant resin composition and a prepreg, a laminate and a printed circuit board laminate made by using the same.

BACKGROUND

In recent years, a voice is becoming higher and higher on environmentally friendly electronic products, resulting in great developments of halogen-free technology. On the other hand, with the advent of the lead-free era, besides halogen-free and flame retardant performance for printed circuit board, the property of matching with lead-free soft solder thereof becomes important. Therefore, printed circuit laminates are required on higher thermal resistance and reliability than before. At present the main technique focuses on phosphorus-modified epoxy resin and benzoxazine resin. As is known to all, compared with ordinary epoxy resin, using phosphorus-modified epoxy resin will increase the water absorption of printed circuit laminate, and lower its thermal and moisture resistance.

In order to solve the problem mentioned above, CN101691449A reports that, through synergistic flame retardancy of phenoxyphosphazene compounds and compounds having a dihydrobenzoxazine ring, the flame retardancy was greatly improved. The cured product has high glass transition temperature (Tg), good thermal resistance, high elastic rate, low dielectric dissipation as well as great flame retardancy and processability. However, the thermal resistance of this solution is limited, and its processability is not entirely satisfactory. In addition, CN 101643570A has put forward a halogen-free flame retardant resin composition, and a prepreg, a laminate and a printed circuit laminate made by using the same. The halogen-free flame retardant resin composition comprises: (A) a mixture of phenoxyphosphazene compound (A1) and compound (A2) having a dihydrobenzoxazine ring, 40-80 parts by weight, and the weight ratio of the phenoxyphosphazene compound (A1) and the compound (A2) having a dihydrobenzoxazine ring is 1:10-1:2; (B) a poly epoxy compound, 15-45 parts by weight; (C) a phenolic resin curing agent, 5-25 parts by weight; and (D) an imidazole compound used as curing accelerator, 0.1-1 parts by weight. However, in the technical solution, a lot of compounds having a dihydrobenzoxazine ring are added, the brittleness of the cured product is greater resulting from more addition of the compounds, therefore, the amount of the compounds cannot be too much. In addition, the action of auxiliary curing agent is ignored in the technical solution, making the performance of resin cured product obtained by the solution difficult to be further improved. Accordingly, it becomes a difficult point in the art that how to add a large amount of compounds having a dihydrobenzoxazine ring and make the resin composition achieve better comprehensive properties.

DETAILED DESCRIPTION

One object of the present invention lies in providing a halogen-free flame retardant resin composition. The resin composition can meet the requirements of halogen-free and flame retardant performance and excellent thermal resistance. The resin composition can also improve the brittleness of the resin by adding a large amount of dihydrobenzoxazine ring cured product which greatly improves the processability of the cured product, thereby making mass production possible.

In order to achieve the object above, the present invention employs the following technical solution:

The present technology is a halogen-free flame retardant resin composition, according to parts by weight, comprising:

(A) a mixture of phenoxyphosphazene compound (A1) and compound (A2) having a dihydrobenzoxazine ring, the mixture comprising 45-90 parts by weight, and the weight ratio of the phenoxyphosphazene compound (A1) and the compound (A2) having a dihydrobenzoxazine ring is between 1:25-1:2; (B) an epoxy resin with epoxy equivalent of 500-2000, the epoxy resin comprising 10-45 parts by weight; (C) a phenolic resin comprising 10-25 parts by weight; and (D) an amine curing agent comprising 0.5-10 parts by weight.

Preferably, the present technology is a halogen-free flame retardant resin composition, according to parts by weight, comprising:

(A) a mixture of phenoxyphosphazene compound (A1) and compound (A2) having a dihydrobenzoxazine ring, 50-90 parts by weight, and the weight ratio of the phenoxyphosphazene compound (A1) and the compound (A2) having a dihydrobenzoxazine ring is 1:20-1:5; (B) an epoxy resin with epoxy equivalent of 500-2000: 10-40 parts by weight; (C) a phenolic resin: 15-25 parts by weight; and (D) an amine curing agent: 1-8 parts by weight.

Preferably, the present technology is a halogen-free flame retardant resin composition, according to parts by weight, comprising:

(A) a mixture of phenoxyphosphazene compound (A1) and compound (A2) having a dihydrobenzoxazine ring, 60-90 parts by weight, and the weight ratio of the phenoxyphosphazene compound (A1) and the compound (A2) having a dihydrobenzoxazine ring is 1:15-1:5; (B) an epoxy resin with epoxy equivalent of 500-2000: 10-35 parts by weight; (C) a phenolic resin: 15-25 parts by weight; and (D) an amine curing agent: 2-7 parts by weight.

The mixture of phenoxyphosphazene compound (A1) and compound (A2) having a dihydrobenzoxazine ring is 45-90 parts by weight, such as 53 parts by weight, 57 parts by weight, 62 parts by weight, 68 parts by weight, 72 parts by weight, 78 parts by weight, 82 parts by weight, 87 parts by weight, or 89 parts by weight.

The weight ratio of the phenoxyphosphazene compound (A1) and the compound (A2) having a dihydrobenzoxazine ring is 1:25-1:2, such as 1:24, 1:22, 1:20, 1:18, 1:16, 1:14, 1:12, 1:10, 1:8, 1:6, 1:4, or 1:3.

The appropriate amount of component (A) is 45-90 parts by weight, besides, to ensure that phenoxyphosphazene compound (A1) and compound (A2) having a dihydrobenzoxazine ring have good flame-retardant synergistic effect and avoid negative effect of phenoxyphosphazene compound (A1), the appropriate weight ratio of the phenoxyphosphazene compound (A1) and the compound (A2) having a dihydrobenzoxazine ring is 1:25-1:2.

The amount of (B) epoxy resin with epoxy equivalent of 500-2000 is 10-45 parts by weight, such as 13 parts by weight, 16 parts by weight, 19 parts by weight, 22 parts by weight, 28 parts by weight, 32 parts by weight, 38 parts by weight, or 43 parts by weight.

The amount of (C) phenolic resin is 10-25 parts by weight, such as 12 parts by weight, 14 parts by weight, 16 parts by weight, 18 parts by weight, 20 parts by weight, 22 parts by weight, 23 parts by weight. The appropriate amount of component (C) is 10-25 parts by weight, when less than 10 parts by weight, the glass transition temperature of the cured product is improved little, while more than 25 parts by weight, the thermal resistance of the cured product deteriorates.

The amount of (D) amine curing agent is 0.5-10 parts by weight, such as 1.2 parts by weight, 2.5 parts by weight, 4 parts by weight, 6 parts by weight, 7 parts by weight, or 9 parts by weight.

The present invention employs phenolic resin and an amine curing agent for synergistic curing, uses phenoxyphosphazene compound (A1) and compound (A2) having a dihydrobenzoxazine ring for synergistic flame retardancy, and adds epoxy resin with epoxy equivalent of 500-2000, improving Tg, thermal resistance and processability of the resin cured product while satisfying halogen-free flame retardancy.

The followings are principle explanations of the present invention:

The phenoxyphosphazene compound (A1) in the present invention is a nitrogen containing, phosphorus containing flame retardant, the mechanism of flame retardancy includes gas phase and solid phase flame retardancy, but if used alone, its flame retardant material is released relatively slowly, and the flame retardant efficiency is not high. Meanwhile, using too little phenoxyphosphazene compound (A1) prevents achieving a flame retardant effect, and using too much can affect other properties of cured product: e.g., when a cured product is exposed to high temperature, the phenoxyphosphazene compound (A1) may migrate or bleed out and the flexural modulus and other physical properties may drop dramatically. However, combining the compound (A2) having a dihydrobenzoxazine ring with flame retardancy and the phenoxyphosphazene compound (A1) can synergistically accelerate the release of flame retardant from phenoxyphosphazene compound (A1), resulting in great improvement of its own flame retardancy.

The present invention employs the synergistic flame retardancy between phenoxyphosphazene compound (A1) and compound (A2) having a dihydrobenzoxazine ring, and adjusts the weight ratio of the phenoxyphosphazene compound (A1) and the compound (A2) having a dihydrobenzoxazine ring between 1:25 and 1:2. The amount of the compound (A2) having a dihydrobenzoxazine ring is much more than the weight ratio of 1:10-1:2 disclosed in CN 101643570A. Increasing the amount of the compound (A2) having a dihydrobenzoxazine ring can reduce the cost of resin compounds, improve flame retardant efficiency of phenoxyphosphazene compound (A1), and further, the migration even bleeding out of phenoxyphosphazene compounds (A1), as well as a sharp decline in physical properties such as flexural strength and other issues could be resolved.

In order to improve the brittleness of the dihydrobenzoxazine ring cured product and improve the processability of resin cured product, the epoxy resin with epoxy equivalent of 500-2000 is added in resin composition. In addition to improving its brittleness, the epoxy resin with epoxy equivalent of 500-2000 will reduce Tg and thermal resistance of resin cured product.

The present invention employs synergistic curing between phenolic resin and amine curing agent. Amine curing agents cure resin depending on —NH2, —NH, and a small amount of free amine groups. If the amine value is low, activity is low, and thus the curing reaction is very slow. However, if the phenolic resin contains a large number of phenolic hydroxyl groups, the activity of which is high, that can promote curing reaction, and thus curing time is very short. Accordingly, synergistic curing between the phenolic resin and the amine curing agent can effectively overcome the migration of phenoxyphosphazene compound (A1) resulting from increasing the amount of the compound (A2) having a dihydrobenzoxazine ring. The reduction of Tg and thermal resistance of the resin cured product caused by the addition of epoxy resin with epoxy equivalent of 500-2000 satisfies the halogen-free flame retardancy, and it improves the Tg, thermal resistance, and processability of the resin cured product. Phenolic resin and amine curing agent in the above proportions can play a role of synergistic curing resin, maximizing both Tg and the thermal resistance of resin cured product.

In the present invention, the softening point of the phenoxyphosphazene compound (A1) in the (A) component is 60-150° C. The phenoxyphosphazene compound (A1) is selected from cyclic phenoxyphosphazene compound shown in structural formula (α) and chain-like phenoxyphosphazene compound shown in structural formula (β):

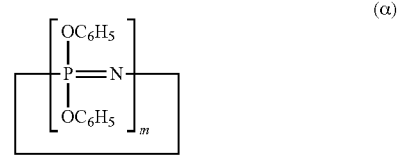

(α)

In the formula, m is an integer of 3-25.

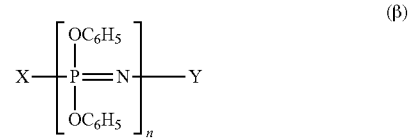

(β)

In the formula, X is —N=P(OC$_6$H$_5$)$_3$ or —N=P(O)C$_6$H$_5$, Y is —P(OC$_6$H$_5$)$_4$ or —P(O)(C$_6$H$_5$)$_2$; n is an integer of 3-100.

As a preferred technical solution, the softening point of the phenoxyphosphazene compound (A1) in the (A) component in the present invention is 60-150° C. The phenoxyphosphazene compound (A1) is selected from a mixture of cyclic phenoxyphosphazene compound shown in structural formula (α) and chain-like phenoxyphosphazene compound shown in structural formula (β), the specific composition is shown as follows:

① The weight percentage of hexaphenoxycyclotriphosphazene compound (in this case, m=3) is 70-90%;
② The weight percentage of octaphenoxycyclotetraphosphazene compound (in this case, m=4) is 3-20%; and
③ The weight percentage of cyclic phenoxyphosphazene compound with m≥5 and chain-like phenoxyphosphazene compound is 1-10%.

The weight percentages above take the sum of ①, ② and ③ as a benchmark, and

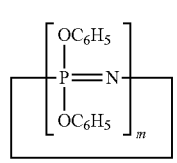

(α)

wherein m is an integer of 3-25.

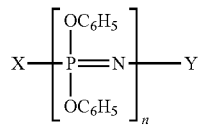

(β)

wherein X is $-N=P(OC_6H_5)_3$ or $-N=P(O)C_6H_5$, Y is $-P(OC_6H_5)_4$ or $-P(O)(C_6H_5)_2$; and n is an integer of 3-100.

Compared with conventional condensed phosphate flame retardants, phenoxyphosphazene compound (A1) can be dissolved in an organic solvent. Further, it is easily uniformly-dispersed in the resin composition, and has the advantage of high thermal decomposition temperature, low water absorption, high resistance to hydrolysis, etc. If using the entire cyclic phenoxyphosphazene compound, its solubility in an organic solvent is poor, and therefore, a chain-like phenoxyphosphazene compound is needed to promote its dissolution. An appropriate amount of the chain-like phenoxyphosphazene compound is required, otherwise the softening point of the phenoxyphosphazene compound (A1) will turn out to be low. Furthermore, when the softening point of the phenoxyphosphazene compound (A1) is lower than 60° C., it will reduce the glass transition temperature of the cured product. When the softening point is higher than 150° C., the intermiscibility of phenoxyphosphazene compound (A1) with other components will be deteriorated.

The compound (A2) having a dihydrobenzoxazine ring in (A) component of the present invention can be prepared by using a compound having a phenolic hydroxyl group, methylamine, and formaldehyde. The preparation method is existing technology. Those skilled in the art are fully capable of preparing compound (A2) having a dihydrobenzoxazine ring according to the methods disclosed in the prior art. Exemplary compound (A2) having a dihydrobenzoxazine ring is any compound selected from bisphenol-A benzoxazine resin shown in structural formula (γ), bisphenol-F benzoxazine resin shown in structural formula (δ), phenolphthalein benzoxazine resin or 4,4'-diaminodiphenyl methane-type benzoxazine resin, or a mixture of two or more thereof. For example, the mixture above is a mixture of 4,4'-diaminodiphenyl methane-type benzoxazine resin and phenolphthalein benzoxazine resin, a mixture of bisphenol-F benzoxazine resin shown in structural formula (δ) and bisphenol-A benzoxazine resin shown in structural formula (γ), a mixture of 4,4'-diaminodiphenyl methane-type benzoxazine resin, phenolphthalein benzoxazine resin and bisphenol-F benzoxazine resin shown in structural formula (δ), a mixture of bisphenol-A benzoxazine resin shown in structural formula (γ), 4,4'-diaminodiphenyl methane-type benzoxazine resin and bisphenol-F benzoxazine resin shown in structural formula (δ), and preferably phenolphthalein benzoxazine resin and/or 4,4'-diaminodiphenyl methane-type benzoxazine resin.

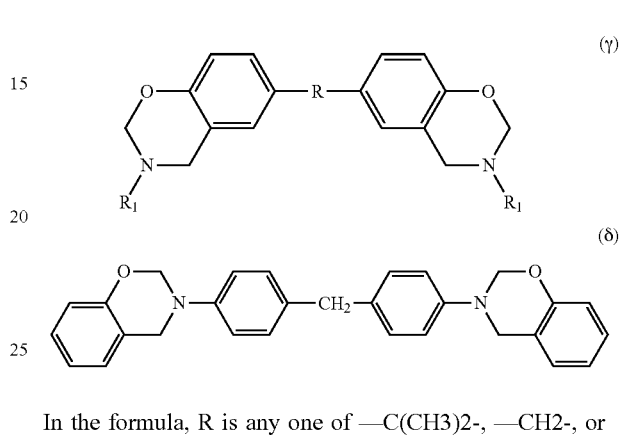

In the formula, R is any one of $-C(CH_3)_2-$, $-CH_2-$, or

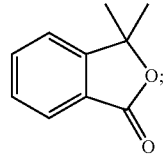

R1 is

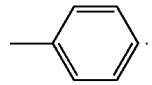

4,4'-diaminodiphenyl methane-type benzoxazine resin is MDA-type benzoxazine resin.

Because the bisphenol-F benzoxazine resin mentioned above contains a methylene group in its molecular structure, it has certain rigidity to its structure as well as relatively good toughness. However, phenolphthalein benzoxazine resin and MDA-type benzoxazine resin have better thermal resistance than the bisphenol-F benzoxazine resin.

The component (B) in the present invention, i.e., the epoxy resin is selected from bisphenol-A epoxy resin with epoxy equivalent of 500-1500, carboxylated nitrile rubber-modified epoxy resin with epoxy equivalent of 700-2000, oxazolidone ring containing halogen-free epoxy resin with epoxy equivalent of 600-1600, or a mixture of at least two or more thereof, preferably bisphenol-A epoxy resin with epoxy equivalent of 500-1500, 10-30 wt % of carboxylated nitrile rubber-modified epoxy resin with epoxy equivalent of 700-2000, oxazolidone ring containing halogen-free epoxy resin with epoxy equivalent of 600-1600, or a mixture of at least two or more thereof. The mixture above is an example of a mixture of an oxazolidone ring containing halogen-free epoxy resin with epoxy equivalent of 600-1600 and 10-30 wt % of carboxylated nitrile rubber-modified epoxy resin with epoxy equivalent of 700-2000, a mixture of 10-30 wt % of carboxylated nitrile rubber-modified epoxy resin with epoxy equivalent of 700-2000 and bisphenol-A epoxy resin with epoxy equivalent of 500-1500, a mixture of oxazolidone ring containing halogen-free epoxy resin with epoxy equivalent of 600-1600 and bisphenol-A epoxy resin with epoxy equivalent of 500-1500, a mixture of oxazolidone ring containing halogen-free epoxy resin with epoxy equivalent of 600-1600, 10-30 wt % of carboxylated nitrile rubber-modified epoxy resin with epoxy equivalent of 700-2000 and bisphenol-A epoxy resin with epoxy equivalent of 500-1500, 10-30 wt % of carboxylated nitrile rubber-modified epoxy resin is based on 100% of total weight of carboxyl butyl rubber and epoxy resin, using 10-30 wt % of carboxylated nitrile rubber-modified epoxy resin.

The component (C) in the present invention, i.e., phenolic resin, is selected from a phenol novolac resin, a bisphenol-A novolac resin, a nitrogen containing novolac resin, and a phosphorus containing novolac resin, or a mixture of two or more thereof. For example, the mixture may be a mixture of phosphorus containing novolac resin and nitrogen containing novolac resin; a mixture of nitrogen containing novolac resin and bisphenol-A novolac resin; a mixture of bisphenol-A novolac resin and phenol novolac resin; a mixture of phosphorus containing novolac resin, nitrogen containing novolac resin and bisphenol-A novolac resin; a mixture of nitrogen containing novolac resin, bisphenol-A novolac resin, phenol novolac resin and phosphorus containing novolac resin, preferably, a phenol novolac resin and/or nitrogen containing novolac resin. The rings in the phenol novolac resin and nitrogen containing novolac resin are aromatic rings having a phenolic skeleton structure that can significantly improve the thermal resistance of the resin cured product. Meanwhile, in addition to improving the thermal resistance, the nitrogen containing novolac resin also improves the flame retardancy of resin cured product.

The component (D) in the present invention is used as a curing agent of the resin composition. The amine curing agent is preferably an aromatic amine curing agent, and more preferably, the amine curing agent is selected from the group consisting of a diaminodiphenyl ether, a diaminodiphenyl sulfone, a diaminodiphenyl methane, an m-xylylenediamine, a benzidine, or a mixture of two or more thereof. For example, the mixture may be a mixture of benzidine and m-xylylenediamine; a mixture of diaminodiphenyl methane and diaminodiphenyl sulfone; a mixture of diaminodiphenyl ether and m-xylylenediamine; a mixture of benzidine, m-xylylenediamine and diaminodiphenyl sulfone; a mixture of m-xylylenediamine, diaminodiphenyl methane, diaminodiphenyl sulfone and diaminodiphenyl ether; or a mixture of benzidine, m-xylylenediamine diaminodiphenyl methane, diaminodiphenyl sulfone and diaminodiphenyl ether.

When the phenolic resin having a phenolic resin structure is a phenol novolac resin with rings and/or a nitrogen containing novolac resin containing aromatic rings and the amine curing agent is an aromatic amine curing agent with, aromatic rings, the phenolic resin and aromatic amine curing agent are synergistic cured. This can significantly increase Tg and thermal resistance of resin cured product and significantly improve the reduction of Tg and thermal resistance caused by adding the epoxy resin with an epoxy equivalent of 500-2000. Additionally, the nitrogen containing novolac resin further improves the flame retardancy of resin cured product.

Preferably, the resin composition in the present invention also comprises (E) curing accelerator.

The component (E) in the present invention is used as a curing accelerator of the resin composition. The curing accelerator is preferably, an imidazole compound, more preferably, is selected from a group consisting of 2-methylimidazole, 2-ethyl-4-methylimidazole, 2-phenylimidazole, 2-undecylimidazole, or a mixture of two or more thereof. For example, the mixture may be 2-undecylimidazole and 2-phenylimidazole; 2-ethyl-4-methylimidazole and 2-methylimidazole; 2-undecylimidazole, 2-phenylimidazole and 2-ethyl-4-methylimidazole; 2-ethyl-4-methylimidazole, 2-methylimidazole and 2-undecylimidazole; or 2-undecylimidazole, 2-phenylimidazole, 2-ethyl-4-methylimidazole and 2-methylimidazole.

Preferably, the amount of the curing accelerator is 0.01-1 parts by weight, e.g., 0.08 parts by weight, 0.15 parts by weight, 0.25 parts by weight, 0.3 parts by weight, 0.45 parts by weight, 0.55 parts by weight, 0.65 parts by weight, 0.8 parts by weight, 0.9 parts by weight, or 0.95 parts by weight. In one embodiment, the curing accelerator is preferably 0.05-0.9 parts by weight, and in an embodiment, the curing accelerator is more preferably 0.1-0.8 parts by weight.

Preferably, the resin composition also comprises component (F), an inorganic filler that is primarily used to adjust some physical properties of the composition. The inorganic filler may be selected from a group consisting of aluminum hydroxide, Bohm stone (boehmite γ-AlOOH), silica, talc, mica, barium sulfate, lithopone, calcium carbonate, wollastonite, kaolin, brucite, diatomite, bentonite, pumice, or a mixture of two or more thereof. For example, the mixture may be aluminum hydroxide and Bohm stone; silica and talc; mica and barium sulfate; lithopone and talc; calcium carbonate and wollastonite; kaolin and brucite, a mixture of diatomite and bentonite; silica, aluminum hydroxide and talc; mica, barium sulfate, lithopone and calcium carbonate; kaolin, brucite, diatomite and bentonite; preferably, aluminum hydroxide, Bohm stone (boehmite γ-AlOOH), silica, talc, mica, or a mixture of at least two or more thereof. More preferably, the mixture may be selected from the group consisting of aluminum hydroxide, Bohm stone, silica, or a mixture two or more thereof. The inorganic filler can be chosen appropriately for intended use. Aluminum hydroxide, Bohm stone and silica can be used as filler, and also can be used as a flame retardant auxiliary of phenoxyphosphazene compound (A1).

The amount of inorganic filler is 6-300 parts by weight, e.g., 14 parts by weight, 45 parts by weight, 70 parts by weight, 98 parts by weight, 125 parts by weight, 149 parts by weight, 178 parts by weight, 194 parts by weight, 215 parts by weight, 265 parts by weight, or 285 parts by weight. The amount of inorganic filler is preferably 10-100 parts by weight and more preferably 20-80 parts by weight.

According to parts by weight, a halogen-free flame retardant resin composition comprises:

(A) a mixture of phenoxyphosphazene compound (A1) and compound (A2) having a dihydrobenzoxazine ring, the mixture comprising 45-90 parts by weight, and the weight ratio of the phenoxyphosphazene compound (A1) and the compound (A2) having a dihydrobenzoxazine ring is between 1:25-1:2; (B) an epoxy resin with epoxy equivalent of 500-2000, the epoxy resin comprising 10-45 parts by weight; (C) a phenolic resin comprising 10-25 parts by weight; (D) an amine curing agent comprising 0.5-10 parts by weight; and (E) a curing accelerator comprising 0.01-1 parts by weight.

According to parts by weight, a halogen-free flame retardant resin composition comprises:

(A) a mixture of phenoxyphosphazene compound (A1) and compound (A2) having a dihydrobenzoxazine ring, the mixture comprising 45-90 parts by weight, and the weight ratio of the phenoxyphosphazene compound (A1) and the compound (A2) having a dihydrobenzoxazine ring is between 1:25-1:2; (B) an epoxy resin with epoxy equivalent of 500-2000, the epoxy resin comprising 10-45 parts by weight; (C) a phenolic resin comprising 10-25 parts by weight; (D) an amine curing agent comprising 0.5-10 parts by weight; (E) a curing accelerator comprising 0.01-1 parts by weight; and (F) a filler comprising 6-300 parts by weight.

The phosphorus content of the halogen-free flame retardant resin composition in the present invention is 0.5-3 wt %, the nitrogen content is 1-10 wt %, and the halogen content is below 0.09 wt %.

The term "comprise" as described in the present invention intends to mean that the composition may comprise other components in addition to the listed components, and these other components provide different properties to the halogen-free resin composition. Additionally, the term "comprise" of the present invention can also be replaced with close-ended "is" or "consist of . . . "

For example, the halogen-free flame retardant resin composition in the present invention can be combined with a coordinated thermosetting resin, e.g., a cyanate ester resin, a polyurethane resin, or a melamine resin, and the curing agents or curing accelerators of these thermosetting resins can also be added. In addition, the halogen-free flame retardant resin composition may further comprise various additives, e.g., a silane coupling agent, a titanate coupling agent, an antioxidant, a thermal stabilizer, an antistatic agent, an ultraviolet absorber, a pigment, a colorant, or a lubricant can be used. These thermosetting resins and various additives may be used alone, or used in combination with two or more.

The preparation method for one halogen-free flame retardant resin composition in the present invention, can involve blending, stirring, and mixing the various components of the resin composition formulation to prepare through known methods.

The second object of the present invention is to provide a prepreg made from the halogen-free flame retardant resin composition, including a base material and the halogen-free flame retardant resin composition above attached on the base material after impregnation and drying. The prepreg above has excellent flame retardancy, and also has the benefit of high glass transition temperature (Tg), high thermal resistance, high flexural strength, high reliability, low dielectric dissipation factor, low water absorption, low C.T.E., as well as excellent chemical resistance and processability.

The prepreg of the present invention is prepared by heating and drying the halogen-free resin composition above, using nonwoven fabric or other fabrics as a base material, e.g., natural fibers, organic synthetic fibers, and inorganic fibers are available for adoption. The method for preparing the prepreg of the present invention is, according to the formulation of halogen-free flame retardant resin composition mentioned above, solid matters are mixed, and then the liquid solvent is added. After stirring until the solid matters are completely dissolved, then liquid resin and curing accelerator are added and continue to be stirred until the composition is homogeneously mixed. Finally the solid content is adjusted to be 65%-75% with PM (propylene glycol methyl ether) solvent, thereby a varnish is prepared. The varnish is used to impregnate the base material, inorganic fabric such as glass cloth or organic fabric. The impregnated glass cloth is put in an oven for heating and drying at 160° C. for 4 minutes. The solvent is, e.g., an alcohol such as methanol, ethanol and butanol; an ether such as ethyl cellosolve, butyl cellosolve, ethylene-methyl ether, carbitol and butylcarbitol; a ketone such as acetone, butanone, methyl ethyl ketone, methyl isobutyl ketone and cyclohexanone; an aromatic hydrocarbon such as toluene, xylene and mesitylene; an ester such as ethoxyethyl acetate and ethyl acetate; a nitrogen containing solvent such as N,N-dimethylformamide, N,N-dimethylacetamide and N-methyl-2-pyrrolidone, etc. These solvents may be used alone or used in combinations of two or more. The combination usage is preferred between aromatic hydrocarbon solvents such as toluene, xylene, and mesitylene and ketone solvents such as acetone, butanone, methyl ethyl ketone, methyl isobutyl ketone, and cyclohexanone.

The third object of the present invention is to provide a laminate. The laminate comprises at least one prepreg mentioned above.

The fourth object of the present invention is to provide a printed circuit board. The printed circuit board is prepared by at least one laminate mentioned above.

The laminate in the present invention comprises adhering one or more prepregs together through heating and pressing. The metal foil is laminated on one or both sides of the laminate and it can be prepared by a hot press. The printed circuit board comprises at least one laminate, prepreg, and metal foil sequentially laminated on one or both sides of the laminate and it can be prepared by a hot press. The lamination has to meet the following requirements: ① the heating rate of lamination should be controlled at 1.5-2.5° C./min when the material temperature is 80-140° C.; ② the pressure setting for lamination is that full pressure is applied at an outer-layer material temperature of 80-100° C., wherein the full pressure is about 350 psi; ③ when being cured, the material temperature is controlled at 185° C. and maintained for 60 minutes. The metal foil refers to copper foil, nickel foil, aluminum foil, SUS foil, or any other appropriate material.

Compared to the existing art, the present invention has the following beneficial effects:

(1) The halogen-free flame retardant resin composition involved in the present invention employs phenoxyphosphazene compound as a flame retardant, which has a significant synergistic flame retardant effect with a compound having a dihydrobenzoxazine ring. Therefore, in the case of greatly reducing the amount of phenoxyphosphazene compound, the composition also can achieve flame retardancy, i.e., the flame retardant efficiency is greatly improved and the migration even bleeding out of the phenoxyphosphazene compound. Further, a sharp decline in physical properties such as flexural strength and other issues will not appear when the board material is exposed to high temperature. (2) The flame retardant used in the halogen-free flame retardant resin composition of the present invention is a phenoxyphosphazene compound which has excellent chemical resistance and high resistance to hydrolysis. Therefore, the printed circuit metal-clad laminate made from the composition has great chemical resistance and Anti-CAF performance, i.e., high reliability. (3) The halogen-free flame retardant resin composition involved in the present invention employs benzoxazine resin as the main resin, and thus the prepreg, laminate and printed circuit using the same have the advantages of high glass transition temperature (Tg), high thermal resistance, low dielectric dissipation factor, low water absorption and low C.T.E., etc. (4) The halogen-free flame retardant resin composition involved in the present invention employs epoxy modified resin with epoxy equivalent of 500-2000. An epoxy resin with epoxy equivalent of 500-2000 has excellent toughness and can significantly improve the mechanical brittleness of benzoxazine cured product. (5) The amine curing agent involved in the present invention is preferably an aromatic amine curing agent. The curing agent will improve the Tg of the cured product and greatly increase its thermal resistance.

Embodiments

To better illustrate the present invention, and facilitate understanding the technical solution, the typical but non-limiting examples of the present invention are illustrated as follows. If there is no special explanation, the "parts" means "parts by weight", the "%" means "wt %."

(A1) Phenoxyphosphazene compounds: SPB-100 (trade name of Japan's Otsuka Chemical Co., Ltd.)

(A2) Compound having a dihydrobenzoxazine ring (A2-1) LZ 8280 (trade name of HUNTSMAN in USA)

(A2-2) D125 (trade name of Dongcai Technology Co. Ltd. in Sichuan)

(B) Epoxy resin with epoxy equivalent of 500-2000

(B-1) BE503 (trade name of Changchun Plastics Co. Ltd.)

(B-2) NP-20/B2 (trade name of AC Catalysts Co. Ltd. in USA)

(B-3) XZ 92566 (trade name of Dow Co. Ltd. in USA)

(C) Phenolic resin (C-1) PHL6635M65 (trade name of John Vincent chemical company in USA)

(C-2) PS 6313 (trade name of Gunei Chemical Industry Co., Ltd. in Japan)

(C-3) XZ 92741 (trade name of Dow Co. Ltd. in USA)

(D) Aromatic amine hardener (D-1) DDS (industry product)

(D-2) DDE (industry product)

(E) Curing accelerator: 2-phenyl imidazole (Shikoku Kasei Co., Ltd. in Japan)

(F) Inorganic filler (F-1) Aluminum hydroxide (purity of 99% or more)

(F-2) Bohm stone (Nabaltec AOH60)

(F-3) Silica (purity of 99% or more)

TABLE 1

Formulation of the Composition (1) (parts by weight)

|  | Ex. 1 | Ex. 2 | Ex. 3 | Ex. 4 | Ex. 5 | Ex. 6 |
|---|---|---|---|---|---|---|
| $A_1$ | 10 | 10 | 10 | 10 | 18 | 18 |
| $A_2$-1 | 35 | 45 | 55 | 65 |  |  |
| $A_2$-2 |  |  |  |  | 45 | 45 |
| B-1 | 15 | 15 |  |  | 25 |  |
| B-2 |  |  | 15 | 15 |  | 25 |
| B-3 |  |  |  |  |  |  |
| C-1 | 7 | 7 | 7 | 7 | 7 | 4 |
| C-2 | 7 | 7 | 7 | 7 | 4 | 7 |
| C-3 |  |  |  |  |  |  |
| D-1 | 1.0 |  | 1.0 | 1.0 | 1.0 | 1.0 |
| D-2 |  | 1.0 |  |  |  |  |
| E | 0.8 | 0.9 | 1.5 | 2.6 | 3.5 | 4.3 |
| F-1 | 10 | 20 |  |  |  |  |
| F-2 |  |  | 10 | 20 |  |  |
| F-3 | 20 | 10 | 20 | 10 |  |  |

TABLE 2

Formulation of the Composition (2) (parts by weight)

|  | Ex. 7 | Ex. 8 | Ex. 9 | Ex. 10 | Ex. 11 | Ex. 12 |
|---|---|---|---|---|---|---|
| $A_1$ | 10 | 6 | 6 | 6 | 15 | 15 |
| $A_2$-1 | 35 | 65 | 65 |  |  | 26 |
| $A_2$-2 | 30 |  |  | 65 | 46 | 20 |
| B-1 |  | 15 |  |  |  |  |
| B-2 |  |  | 15 |  | 26 | 26 |
| B-3 | 15 |  |  | 15 |  |  |
| C-1 | 10 | 8 | 4 | 8 | 4 | 4 |
| C-2 | 2 | 4 | 8 | 4 | 8 | 8 |
| C-3 |  |  | 5 | 5 | 5 |  |
| D-1 | 1.0 |  | 1.0 | 1.0 | 1.0 | 1.0 |
| D-2 |  | 2.0 |  |  |  |  |
| E | 3.6 | 3.7 | 4.8 | 5.6 | 8.1 | 7.2 |
| F-1 |  | 10 |  |  | 30 | 30 |
| F-2 | 30 |  | 10 | 30 |  |  |
| F-3 |  | 20 | 20 |  |  |  |

TABLE 3

Formulation of the Composition (3) (parts by weight)

|  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|
| $A_1$ | 10 | 10 | 10 | 10 | 25 | 25 |
| $A_2$-1 | 65 | 65 | 65 | 65 | 35 |  |
| $A_2$-2 |  |  |  |  |  | 35 |
| B-1 | 15 | 15 | 15 | 15 |  | 28 |
| B-2 |  |  |  |  | 28 |  |
| B-3 |  |  |  |  |  |  |
| C-1 | 12 | 8 | 12 | 8 | 4 | 4 |
| C-2 |  | 4 |  | 4 | 7 | 7 |
| C-3 |  |  |  |  |  |  |
| D-1 | 2.0 | 2.0 |  |  | 1.0 | 1.0 |
| D-2 |  |  |  |  |  |  |
| E | 1.2 | 2.5 | 2.3 | 3.8 | 4.6 | 7.5 |
| F-1 | 10 | 10 | 10 | 10 | 20 | 20 |
| F-2 |  |  |  |  |  |  |
| F-3 | 20 | 20 | 20 | 20 |  |  |

Example 13

According to parts by weight, a halogen-free flame retardant resin composition comprises:

(A) a mixture of phenoxyphosphazene compound (A1) and compound (A2) having a dihydrobenzoxazine ring, the mixture comprising 45 parts by weight, the weight ratio of the phenoxyphosphazene compound (A1) and the compound (A2) having a dihydrobenzoxazine ring is 1:25; (B) a bisphenol-A epoxy resin with epoxy equivalent of 1500, the epoxy resin comprising 45 parts by weight; (C) a nitrogen containing novolac resin comprising 10 parts by weight; and (D) a diaminodiphenyl ether comprising 0.5 parts by weight.

The softening point of A1 is 100-110° C. A1 is a mixture of cyclic phenoxyphosphazene compound and chain-like phenoxyphosphazene compound as shown in the following structural formulas:

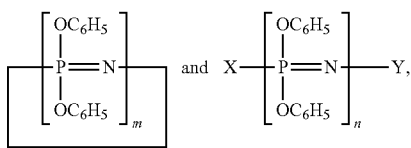

where m is an integer of 3-25; X is —N═P(OC$_6$H$_5$)$_3$; Y is —P(OC$_6$H$_5$)$_4$ and n is an integer of 3-100.

A2 is bisphenol-A benzoxazine resin shown in the following structural formula:

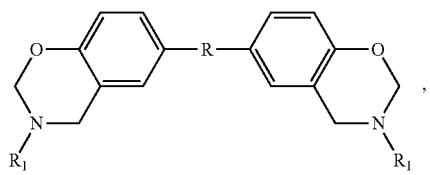

where R is —C(CH$_3$)$_2$— and R1 is

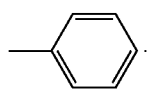

Example 14

According to parts by weight, a halogen-free flame retardant resin composition comprises:

(A) a mixture of phenoxyphosphazene compound (A1) and compound (A2) having a dihydrobenzoxazine ring: 90 parts by weight, the weight ratio of the phenoxyphosphazene compound (A1) and the compound (A2) having a dihydrobenzoxazine ring is 1:2; (B) a bisphenol-A epoxy resin with epoxy equivalent of 500: 30 parts by weight; (C) A phenol novolac resin: 20 parts by weight; and (D) a diaminodiphenyl sulfone: 10 parts by weight.

The softening point of A1 is 100-110° C., which is a mixture of cyclic phenoxyphosphazene compound and chain-like phenoxyphosphazene compound as shown in the following structural formulas:

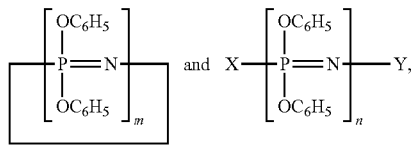

where m is an integer of 3-25; X is —N=P(OC$_6$H$_5$)$_3$; Y is —P(OC$_6$H$_5$)$_4$ and n is an integer of 3-100.

A2 is bisphenol-F benzoxazine resin shown in the following structural formula:

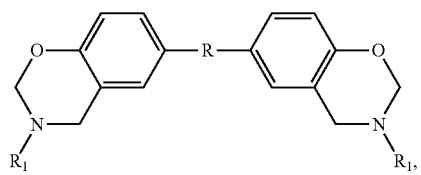

where R is —C(CH$_3$)$_2$— and R1 is

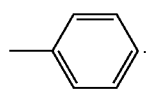

Example 15

According to parts by weight, a halogen-free flame retardant resin composition comprises:

(A) a mixture of phenoxyphosphazene compound (A1) and compound (A2) having a dihydrobenzoxazine ring comprising 65 parts by weight, the weight ratio of the phenoxyphosphazene compound (A1) and the compound (A2) having a dihydrobenzoxazine ring is 1:10; (B) a bisphenol-A epoxy resin with epoxy equivalent of 1000 comprising 10 parts by weight; (C) a bisphenol-A novolac resin comprising 25 parts by weight; and (D) an m-xylylenediamine comprising 5 parts by weight.

The softening point of A1 is 100-110° C., which is a mixture of cyclic phenoxyphosphazene compound and chain-like phenoxyphosphazene compound as shown in the following structural formulas:

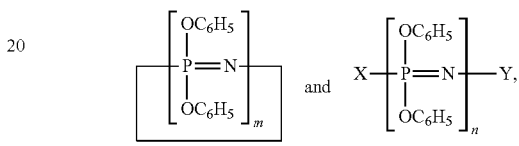

where m is an integer of 3-25; X is —N=P(OC$_6$H$_5$)$_3$; Y is —P(OC$_6$H$_5$)$_4$ and n is an integer of 3-100. A2 is phenolphthalein benzoxazine resin.

Example 16

According to parts by weight, a halogen-free flame retardant resin composition comprises:

(A) a mixture of phenoxyphosphazene compound (A1) and compound (A2) having a dihydrobenzoxazine ring, the mixture comprising 45 parts by weight, the weight ratio of the phenoxyphosphazene compound (A1) and the compound (A2) having a dihydrobenzoxazine ring is 1:25; (B) a 10 wt % of carboxylated nitrile rubber-modified epoxy resin with epoxy equivalent of 700 comprising 20 parts by weight; (C) a nitrogen containing novolac resin comprising 10 parts by weight; (D) a diaminodiphenyl methane comprising 0.5 parts by weight; (E) a 2-methylimidazole comprising 0.01 parts by weight; and (F) an aluminum hydroxide comprising 300 parts by weight.

The softening point of A1 is 100-110° C., which is a mixture of cyclic phenoxyphosphazene compound shown in structural formula (α) and chain-like phenoxyphosphazene compound shown in structural formula (β), the specific composition is shown as follows:

① The weight percentage of hexaphenoxycyclotriphosphazene compound is 85%;

② The weight percentage of octaphenoxycyclotetraphosphazene compound is 14%; and ③ The weight percentage of cyclic phenoxyphosphazene compound with m≥5 and chain-like phenoxyphosphazene compound is 1%.

The weight percentages above take the sum of ①, ② and ③ as a benchmark.

(α)

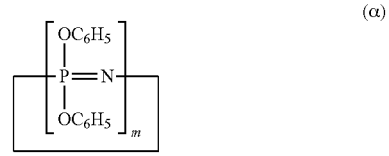

-continued

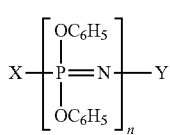
(β)

In the formula, m is an integer of 3-25; X is —N=P(O)C$_6$H$_5$; Y is —P(OC$_6$H$_5$)$_2$; n is an integer of 3-100. A2 is 4,4'-diaminodiphenyl methane-type benzoxazine resin.

Example 17

According to parts by weight, a halogen-free flame retardant resin composition comprises:

(A) a mixture of phenoxyphosphazene compound (A1) and compound (A2) having a dihydrobenzoxazine ring: 90 parts by weight, the weight ratio of the phenoxyphosphazene compound (A1) and the compound (A2) having a dihydrobenzoxazine ring is 1:2; (B) a 30 wt % of carboxylated nitrile rubber-modified epoxy resin with epoxy equivalent of 2000: 10 parts by weight; (C) a nitrogen containing novolac resin: 25 parts by weight; (D) a diaminodiphenyl sulfone: 10 parts by weight; (E) a 2-undecylimidazole: 1 parts by weight; and (F) an Bohm stone: 150 parts by weight.

The softening point of A1 is 100-110° C., which is a mixture of cyclic phenoxyphosphazene compound shown in structural formula (α) and chain-like phenoxyphosphazene compound shown in structural formula (β), the specific composition is shown as follows:

① The weight percentage of hexaphenoxycyclotriphosphazene compound is 90%;

② The weight percentage of octaphenoxycyclotetraphosphazene compound is 3%; and

③ The weight percentage of cyclic phenoxyphosphazene compound with m≥5 and chain-like phenoxyphosphazene compound is 7%.

The weight percentages above take the sum of ①, ② and ③ as a benchmark.

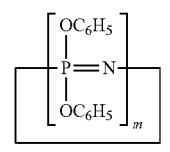
(α)

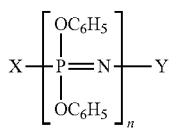
(β)

In the formula, m is an integer of 3-25; X is —N=P(O)C$_6$H$_5$; Y is —P(OC$_6$H$_5$)$_2$; n is an integer of 3-100. A2 is 4,4'-diaminodiphenyl methane-type benzoxazine resin.

Example 18

According to parts by weight, a halogen-free flame retardant resin composition comprises:

(A) a mixture of phenoxyphosphazene compound (A1) and compound (A2) having a dihydrobenzoxazine ring: 60 parts by weight, the weight ratio of the phenoxyphosphazene compound (A1) and the compound (A2) having a dihydrobenzoxazine ring is 1:12; (B) a 20 wt % of carboxylated nitrile rubber-modified epoxy resin with epoxy equivalent of 1500: 45 parts by weight; (C) a bisphenol-A novolac resin: 15 parts by weight; (D) a benzidine: 5 parts by weight; (E) a 2-phenylimidazole: 0.5 parts by weight; and (F) a silica: 6 parts by weight.

The softening point of A1 is 100-110° C., which is a mixture of cyclic phenoxyphosphazene compound shown in structural formula (α) and chain-like phenoxyphosphazene compound shown in structural formula (β), the specific composition is shown as follows:

① The weight percentage of hexaphenoxycyclotriphosphazene compound is 70%;

② The weight percentage of octaphenoxycyclotetraphosphazene compound is 20%; and ③ The weight percentage of cyclic phenoxyphosphazene compound with m≥5 and chain-like phenoxyphosphazene compound is 10%.

The weight percentages above take the sum of ①, ② and ③ as a benchmark.

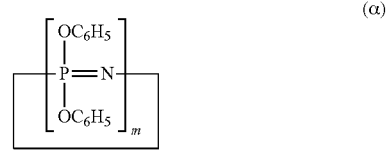
(α)

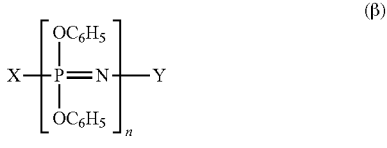
(β)

In the formula, m is an integer of 3-25; X is —N=P(O)C$_6$H$_5$; Y is —P(OC$_6$H$_5$)$_2$; n is an integer of 3-100. A2 is phenolphthalein benzoxazine resin.

Example 19

According to parts by weight, a halogen-free flame retardant resin composition comprises:

(A) a mixture of phenoxyphosphazene compound (A1) and compound (A2) having a dihydrobenzoxazine ring: 60 parts by weight, the weight ratio of the phenoxyphosphazene compound (A1) and the compound (A2) having a dihydrobenzoxazine ring is 1:12; (B) a 20 wt % of carboxylated nitrile rubber-modified epoxy resin with epoxy equivalent of 1500: 45 parts by weight; (C) a bisphenol-A novolac resin: 15 parts by weight; (D) a benzidine: 5 parts by weight; (E) a 2-phenylimidazole: 0.5 parts by weight; and (F) a silica: 6 parts by weight.

The softening point of A1 is 65-75° C., which is a mixture of cyclic phenoxyphosphazene compound shown in structural formula (α) and chain-like phenoxyphosphazene compound shown in structural formula (β), the specific composition is shown as follows:

① The weight percentage of hexaphenoxycyclotriphosphazene compound is 75%;

② The weight percentage of octaphenoxycyclotetraphosphazene compound is 15%; and ③ The weight percentage of cyclic phenoxyphosphazene compound with m≥5 and chain-like phenoxyphosphazene compound is 10%.

The weight percentages above take the sum of ①, ② and ③ as a benchmark.

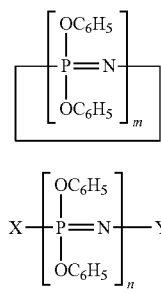

(α)

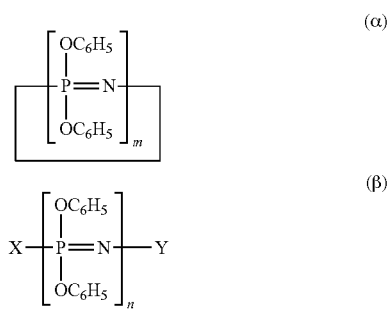

(β)

In the formula, m is an integer of 3-25; X is —N=P(O)C$_6$H$_5$; Y is —P(OC$_6$H$_5$)$_2$; n is an integer of 3-100. A2 is phenolphthalein benzoxazine resin.

Example 20

According to parts by weight, a halogen-free flame retardant resin composition comprises:

(A) a mixture of phenoxyphosphazene compound (A1) and compound (A2) having a dihydrobenzoxazine ring: 60 parts by weight, the weight ratio of the phenoxyphosphazene compound (A1) and the compound (A2) having a dihydrobenzoxazine ring is 1:12; (B) a 20 wt % of carboxylated nitrile rubber-modified epoxy resin with epoxy equivalent of 1500: 45 parts by weight; (C) a bisphenol-A novolac resin: 15 parts by weight; (D) a benzidine: 5 parts by weight; (E) a 2-phenylimidazole: 0.5 parts by weight; and (F) a silica: 6 parts by weight.

The softening point of A1 is 140-150° C., which is a mixture of cyclic phenoxyphosphazene compound shown in structural formula (α) and chain-like phenoxyphosphazene compound shown in structural formula (β), the specific composition is shown as follows:

① The weight percentage of hexaphenoxycyclotriphosphazene compound is 80%;

② The weight percentage of octaphenoxycyclotetraphosphazene compound is 15%; and ③ The weight percentage of cyclic phenoxyphosphazene compound with m≥5 and chain-like phenoxyphosphazene compound is 5%.

The weight percentages above take the sum of ①, ② and ③ as a benchmark.

(α)

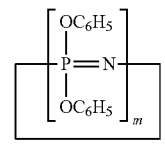

(β)

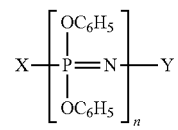

In the formula, m is an integer of 3-25; X is —N=P(O)C$_6$H$_5$; Y is —P(OC$_6$H$_5$)$_2$; n is an integer of 3-100. A2 is phenolphthalein benzoxazine resin.

Comparative Example 7

Comparative example 7 is the example 1 disclosed in CN 101643570A.

The method for preparing the prepreg is: according to the formulation of halogen-free flame retardant resin composition mentioned above, solid matters are mixed, and then liquid solvent is added. After stirring until the solid matters are completely dissolved, the liquid resin and curing accelerator are added and the composition continues to be stirred until it is homogeneously mixed. Lastly, the solid content is adjusted to be 65%-75% with PM (propylene glycol methyl ether) solvent, thereby a varnish is prepared. The varnish is used to impregnate the base material. The impregnated glass cloth is put in an oven for heating and drying at 160° C. for 4 minutes.

The laminate for printed circuits comprises the laminate prepared by adhering one or more prepregs together through heating and pressing, and the metal foils adhered on one or both sides of the laminate. The laminate is a double-side metal-clad laminate consequently formed by using 8 prepregs above and 2 metal foils of 1 ounce (a thickness of 35 μm) overlapping together, laminated with a hot press. The lamination should meet the following requirements: ① the heating rate of lamination should be controlled at 1.5-2.5° C./min when the material temperature is 80-140° C.; ② the pressure setting for lamination is that full pressure is applied at an outer-layer material temperature of 80-100° C., wherein the full pressure is about 350 psi; ③ when being cured, the material temperature is controlled at 185° C. and maintained for 60 min. The metal foil refers to copper foil, nickel foil, aluminum foil, SUS foil, or any other appropriate material.

The properties, such as dielectric dissipation factor, thermal resistance, water absorption, C.T.E., glass transition temperature and flame retardancy, of the laminate for printed circuit board (8 prepregs) above are tested, as shown in Table 4, Table 5, and Table 6.

TABLE 4

| Performance Evaluation (1) | | | | | | |
|---|---|---|---|---|---|---|
|  | Ex. 1 | Ex. 2 | Ex. 3 | Ex. 4 | Ex. 5 | Ex. 6 |
| Glass Transition Temp. (T$_g$, ° C.) | 144 | 152 | 153 | 164 | 167 | 196 |
| Peel Strength (N/mm) | 1.35 | 1.37 | 1.43 | 1.52 | 1.42 | 1.51 |
| Flame Resistance (1.60 mm) | V-1 | V-0 | V-0 | V-0 | V-0 | V-0 |

TABLE 4-continued

| Performance Evaluation (1) | | | | | | |
|---|---|---|---|---|---|---|
| | Ex. 1 | Ex. 2 | Ex. 3 | Ex. 4 | Ex. 5 | Ex. 6 |
| Flame Resistance (0.80 mm) | V-1 | V-1 | V-0 | V-0 | V-0 | V-0 |
| Solder Dipping (delamination) | Δ | Δ | ◯ | ◯ | ◯ | ◯ |
| Solder Dipping (measling) | Δ | Δ | ◯ | ◯ | ◯ | ◯ |
| Water Absorption (%) | 0.11 | 0.12 | 0.10 | 0.11 | 0.09 | 0.09 |
| Dielectric Dissipation Factor (1 GHZ) | 0.005 | 0.005 | 0.005 | 0.005 | 0.005 | 0.005 |
| Flexural Strength (N/mm$_2$) | 530 | 550 | 600 | 640 | 540 | 570 |
| Punchability | ◯ | ◎ | ◯ | ◎ | ◯ | ◯ |
| Halogen Content (%) | 0.03 | 0.03 | 0.03 | 0.03 | 0.03 | 0.03 |
| Migration Resistance | ◯ | ◯ | ◎ | ◎ | ◯ | ◯ |
| Anti-CAF Performance (h) | >1000 | >1000 | >1500 | >1500 | >1000 | >1000 |
| Alkali Resistance | ◯ | ◯ | ◎ | ◎ | Δ | Δ |

TABLE 5

| Performance Evaluation (2) | | | | | | |
|---|---|---|---|---|---|---|
| | Ex. 7 | Ex. 7 | Ex. 9 | Ex. 10 | Ex. 11 | Ex. 12 |
| Glass Transition Temperature (T$_g$, ° C.) | 175 | 171 | 168 | 175 | 163 | 162 |
| Peel Strength (N/mm) | 1.44 | 1.42 | 1.51 | 1.40 | 1.58 | 1.61 |
| Flame Resistance (1.60 mm) | V-0 | V-0 | V-0 | V-0 | V-0 | V-0 |
| Flame Resistance (0.80 mm) | V-0 | V-0 | V-0 | V-0 | V-0 | V-0 |
| Solder Dipping (delamination) | ◯ | ◯ | ◯ | ◯ | ◯ | ◯ |
| Solder Dipping (measling) | Δ | ◯ | ◯ | ◯ | ◯ | ◯ |
| Water Absorption (%) | 0.10 | 0.08 | 0.08 | 0.08 | 0.08 | 0.08 |
| Dielectric Dissipation Factor (1 GHZ) | 0.005 | 0.005 | 0.005 | 0.005 | 0.005 | 0.005 |
| Flexural Strength (N/mm$_2$) | 650 | 550 | 550 | 550 | 550 | 550 |
| Punchability | ◯ | ◯ | ◯ | ◯ | ◯ | ◯ |
| Halogen Content(%) | 0.03 | 0.03 | 0.03 | 0.03 | 0.03 | 0.03 |
| Migration Resistance | ◯ | ◯ | ◯ | ◯ | Δ | Δ |
| Anti-CAF Performance(h) | >1500 | >1500 | >1500 | >1500 | >1000 | >1000 |
| Alkali Resistance | ◯ | ◯ | ◯ | ◯ | Δ | Δ |

TABLE 6

Performance Evaluation (3)

| | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|
| Glass Transition Temp. ($T_g$, °C.) | 165 | 172 | 142 | 149 | 141 | 153 | 144 |
| Peel Strength (N/Mm) | 1.49 | 1.61 | 1.41 | 1.60 | 1.48 | 1.43 | 1.45 |
| Flame Resistance (1.60 mm) | V-0 | V-0 | V-0 | V-0 | V-0 | V-0 | V-0 |
| Flame Resistance (0.80 mm) | V-0 | V-0 | V-1 | V-0 | V-0 | V-0 | V-0 |
| Solder Dipping (Delamination) | ○ | ○ | ○ | ○ | ○ | ○ | ○ |
| Solder Dipping (Measling) | ○ | ○ | ○ | ○ | ○ | ○ | ○ |
| Water Absorption (%) | 0.09 | 0.10 | 0.012 | 0.013 | 0.09 | 0.09 | 0.11 |
| Dielectric Dissipation Factor (1 GHZ) | 0.005 | 0.005 | 0.005 | 0.005 | 0.005 | 0.005 | 0.005 |
| Flexural Strength (N/Mm$_2$) | 540 | 550 | 480 | 490 | 500 | 500 | 630 |
| Punchability | ◎ | ◎ | ◎ | ◎ | ○ | ○ | ○ |
| Halogen Content(%) | 0.03 | 0.03 | 0.03 | 0.03 | 0.03 | 0.03 | 0.03 |
| Migration Resistance | ○ | ○ | ○ | ○ | ○ | ○ | ○ |
| Anti-CAF Performance(H) | >1500 | >1500 | >1500 | >1000 | >1000 | >1000 | >1000 |
| Alkali Resistance | ◎ | ◎ | ◎ | ○ | ○ | ○ | ○ |

TABLE 7

Performance Evaluation (4)

| | Ex. 13 | Ex. 14 | Ex. 15 | Ex. 16 | Ex. 17 | Ex. 18 | Ex. 19 | Ex. 20 |
|---|---|---|---|---|---|---|---|---|
| Glass Transition Temp. ($T_g$ °C.) | 140 | 155 | 182 | 149 | 175 | 139 | 145 | 143 |
| Peel Strength (N/mm) | 1.72 | 1.61 | 1.45 | 1.28 | 1.46 | 1.58 | 1.52 | 1.55 |
| Flame Resistance (1.60 mm) | V-1 | V-0 | V-0 | V-0 | V-0 | V-1 | V-0 | V-0 |
| Flame Resistance (0.80 mm) | V-1 | V-0 | V-0 | V-0 | V-0 | V-1 | V-0 | V-0 |
| Solder Dipping (delamination) | ○ | ○ | ○ | Δ | ○ | ○ | ◎ | ◎ |
| Solder Dipping (measling) | ○ | ○ | ○ | Δ | ○ | ○ | ◎ | ◎ |
| Water Absorption (%) | 0.13 | 0.10 | 0.08 | 0.015 | 0.09 | 0.09 | 0.08 | 0.08 |
| Dielectric Dissipation Factor (1 GHZ) | 0.005 | 0.005 | 0.005 | 0.005 | 0.005 | 0.005 | 0.005 | 0.005 |
| Flexural Strength (N/mm$_2$) | 580 | 550 | 490 | 440 | 480 | 550 | 540 | 540 |
| Punchability | ◎ | ◎ | ○ | ○ | ◎ | ○ | Δ | Δ |
| Halogen Content(%) | 0.03 | 0.03 | 0.03 | 0.03 | 0.03 | 0.03 | 0.03 | 0.03 |
| Migration Resistance | ◎ | Δ | ◎ | ◎ | ○ | ◎ | ◎ | ◎ |

TABLE 7-continued

| | Performance Evaluation (4) | | | | | | | |
|---|---|---|---|---|---|---|---|---|
| | Ex. 13 | Ex. 14 | Ex. 15 | Ex. 16 | Ex. 17 | Ex. 18 | Ex. 19 | Ex. 20 |
| Anti-CAF Performance(h) | >1500 | >1000 | >1500 | <1000 | >1500 | >1500 | >1000 | >1000 |
| Alkali Resistance | ⊚ | ○ | ⊚ | Δ | ○ | ⊚ | ⊚ | ⊚ |

The test methods of the performances above are as follows:

(a) Glass transition temperature (Tg): measured according to the differential scanning calorimetry (DSC) as the method stipulated under IPC-TM-650 2.4.25.

(b) Peel strength: the peel strength of the metal covering layer was measured according to the experiment conditions "after thermal stress" in the method of IPC-TM-650 2.4.8.

(c) Flame resistance: measured according to UL94 vertical firing method.

(d) Solder dipping: the sample (100×100 mm base material) was placed in a pressure cooker at 121° C., 105 Kpa for 2 hours, and then immersed in a solder pot heated to a temperature of 260° C. for 20 seconds, and it was observed by the naked eye that (h1) if delamination happens, and (h2) if measling or blister happens. In the tables, the symbol ⊚ represents no change, ○ represents individual white dots, Δ represents a large area of measling, and x indicates delamination.

(e) Water absorption: measured according to the method of IPC-TM-650 2.6.2.1.

(f) dielectric dissipation factor: the dielectric dissipation factor at 1 GHZ was measured according to the resonance method using a strip line, in accordance with the method stipulated under IPC-TM-650 2.5.5.5.

(g) flexural strength: measured by imposing load on the sample with the specified size and shape at room temperature, according to the method of IPC-TM-650 2.4.4.

(h) punchability: the base material with a thickness of 1.6 mm was placed on a die device with certain patterns for punching, and observed by the naked eye that the (h1) hole edge is smooth, without a white circle, the (h2) hole edge has a white circle of more than 1 mm, the (h3) hole edge has a white circle of more than >3 mm, the (h4) hole edge has cracking, and they are represented by ⊚ for h1, ○ for h2, Δ for h3, x for h4, respectively in the tables.

(i) halogen content: measured according to the method of JPCA-ES-01-2003 "testing method for halogen-free copper-clad laminate," using oxygen combustion method and ion chromatography to measure the halogen content of copper-clad laminate.

(j) migration resistance: the baseboard of 100×100 mm was placed in an oven at 200° C. and baked for 4 hours, and observed by the naked eye to determine if the baseboard (h1) has no bleeding, (h2) has only individual punctate bleeding, (h3) has bleeding of more than 1 mm, (h4) has bleeding of more than 3 mm, and they are represented ⊚ for h1, ○ for h2, Δ for h3, x for h4, respectively in the tables.

(k) Anti-CAF performance: measured according to the method of Enterprise Standard Q/DZAD650 2.6.25 of Guangdong Shengyi Technology Co., Ltd.

(l) alkali resistance: the baseboard of 50×50 mm is immersed in 80° C., 10% of sodium hydroxide solution for 60 minutes, and observed by naked eyes that the baseboard has (h1) no white spots, (h2) point-like white spots, (h3) flaky white spots, (h4) entire board-like white spots, and they are represented by ⊚ for h1, ○ for h2, Δ for h3, x for h4, respectively in the tables.

From the above results, the present invention can achieve a high glass transition temperature, high peel strength, high flexural strength, high reliability, flame resistance, solder dipping, chemical resistance, water absorption and low dielectric dissipation factor, while having an excellent processability, and halogen content that can reach the V-0 standard of flame retardancy test UL94 in the range of JPCA halogen-free standards. The present invention takes full advantage of synergistic flame retardancy of phenoxyphosphazene compound and benzoxazine resin, the halogen content is below 0.09 wt %, so as to achieve the effect of environmental protection.

The above examples are only some preferred examples of the present invention. Those of ordinary skill in the art may make other corresponding changes and modifications according to the technical solution and technical design of the present invention, and all of these changes and modifications should belong to the protection scope of the present invention claims.

The applicant states that the present invention illustrates the detailed composition of the present invention through the examples above, but is not limited to the detailed composition above, i.e., it does not mean the present invention must be embodied depending on the detailed composition above. Those skilled in the art should understand, any improvement to the present invention, equivalent replacement for each material of the product of the present invention, addition of auxiliary components all fall into the protection scope and disclosure scope of the present invention.

What is claimed is:

1. A halogen-free flame retardant resin composition, according to parts by weight, the resin composition comprising:
   (A) a mixture of phenoxyphosphazene compound (A1) and compound (A2) having dihydrobenzoxazine ring, the mixture comprising 45-90 parts by weight, and the weight ratio of the phenoxyphosphazene compound (A1) and the compound (A2) having dihydrobenzoxazine ring is 1:25-1:12;
   (B) an epoxy resin with epoxy equivalent of 500-2000, the epoxy resin comprising 10-45 parts by weight;
   (C) a phenolic resin, the phenolic resin comprising 10-25 parts by weight; and
   (D) an amine curing agent, the curing agent comprising 0.5-10 parts by weight.

2. The halogen-free flame retardant resin composition of claim 1, according to parts by weight, the resin composition comprising:
   (A) a mixture of phenoxyphosphazene compound (A1) and compound (A2) having a dihydrobenzoxazine ring, the mixture comprising 50-90 parts by weight, and the weight ratio of the phenoxyphosphazene compound (A1) and the compound(A2) having a dihydrobenzoxazine ring is 1:20-1:12;
(B) an epoxy resin with epoxy equivalent of 500-2000, the epoxy resin comprising 10-40 parts by weight;
(C) a phenolic resin, the phenolic resin comprising 15-25 parts by weight; and
(D) an amine curing agent, the curing agent comprising 1-8 parts by weight.

3. The halogen-free flame retardant resin composition of claim 2, according to parts by weight, the halogen-free resin composition comprising:
(A) a mixture of phenoxyphosphazene compound (A1) and compound (A2) having a dihydrobenzoxazine ring, the mixture comprising 60-90 parts by weight, and the weight ratio of the phenoxyphosphazene compound (A1) and the compound (A2) having a dihydrobenzoxazine ring is 1:15-1:12 1:15 1:5;
(B) an epoxy resin with epoxy equivalent of 500-2000, the epoxy resin comprising 10-35 parts by weight;
(C) a phenolic resin, the phenolic resin comprising 15-25 parts by weight, and
(D) an amine curing agent, the curing agent comprising 2-7 parts by weight.

4. The halogen-free flame retardant resin composition of claim 1, wherein the softening point of the phenoxyphosphazene compound (A1) is 60-150° C., which is selected from a mixture of cyclic phenoxyphosphazene compound shown in structural formula (α) and chain-like phenoxyphosphazene compound shown in structural formula (β):

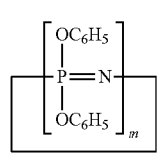

(α)

wherein m is an integer of 3-25; and

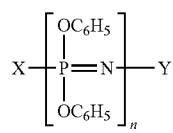

(β)

wherein X is —N═P(OC$_6$H$_5$)$_3$ or —N═P(O)C$_6$H$_5$, Y is —P(OC$_6$H$_5$)$_4$ or —P(O)(C$_6$H$_5$)$_2$; and n is an integer of 3-100.

5. The halogen-free flame retardant resin composition of claim 4, wherein the softening point of the phenoxyphosphazene compound (A1) is 60-150° C., which is selected from a mixture of cyclic phenoxyphosphazene compound shown in structural formula (α) and chain-like phenoxyphosphazene compound shown in structural formula (β), the specific composition is as follows:
① the weight percentage of hexaphenoxycyclotriphosphazene compound is 70-90%;
② the weight percentage of octaphenoxycyclotetraphosphazene compound is 3-20%;
③ the weight percentage of cyclic phenoxyphosphazene compound with m≥5 and chain-like phenoxyphosphazene compound is 1-10%; and the weight percentages above take the sum of ①, ② and ③ as a benchmark; and

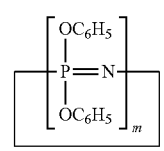

(α)

wherein m is an integer of 3-25;

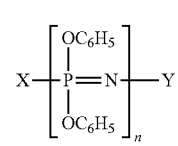

(β)

wherein X is —N═P(OC$_6$H$_5$)$_3$ or —N═P(O)C$_6$H$_5$; Y is —P(OC$_6$H$_5$)$_4$ or —P(O)(C$_6$H$_5$)$_2$; and n is an integer of 3-100.

6. The halogen-free flame retardant resin composition of claim 5, wherein the compound (A2) having dihydrobenzoxazine ring is selected from a group consisting of bisphenol-A benzoxazine resin shown in structural formula (γ), bisphenol-F benzoxazine resin shown in structural formula (δ), phenolphthalein benzoxazine resin or 4,4'-diaminodiphenyl methane-type benzoxazine resin, or a combination of two or more thereof; and

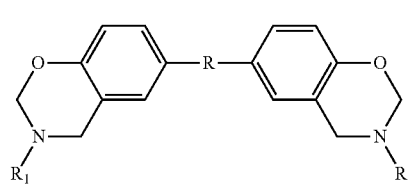

(γ)

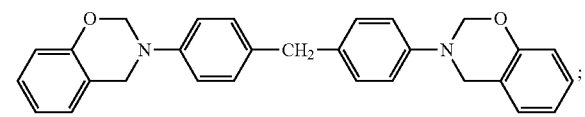

(δ)

wherein R is any one of —C(CH$_3$)$_2$—, —CH$_2$—, or

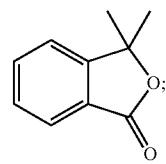

and
R$_1$ is

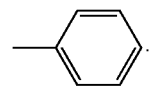

7. The halogen-free flame retardant resin composition of claim 1 wherein the epoxy resin is selected from a group consisting of bisphenol-A epoxy resin with epoxy equivalent of 500-1500, a carboxylated nitrile rubber-modified epoxy resin with epoxy equivalent of 700-2000, an oxazolidone ring containing halogen-free epoxy resin with epoxy equivalent of 600-1600, or a combination of two or more thereof.

8. The halogen-free flame retardant resin composition of claim 1, wherein the phenolic resin is selected from a group consisting of a phenol novolac resin, a bisphenol-A novolac resin, a nitrogen-containing novolac resin, a phosphorus-containing novolac resin, or a combination of two or more thereof.

9. The halogen-free flame retardant resin composition of claim 1, wherein the amine curing agent is an aromatic amine curing agent, selected from the group consisting of diaminodiphenyl ether, diaminodiphenyl sulfone, diaminodiphenyl methane, m-xylylenediamine and benzidine, or a combination of two or more thereof.

10. The halogen-free flame retardant resin composition of claim 1, wherein the resin composition further comprises a curing accelerator.

11. The halogen-free flame retardant resin composition of claim 10, wherein the curing accelerator is selected from the group consisting of 2-methylimidazole, 2-ethyl-4-methylimidazole, 2-phenylimidazole, 2-undecylimidazole, or a combination of two or more thereof.

12. The halogen-free flame retardant resin composition of claim 11, wherein the amount of the curing accelerator is 0.01-1 parts by weight.

13. The halogen-free flame retardant resin composition of claim 11, wherein the resin composition also comprises an inorganic filler, selected from a group consisting of aluminum hydroxide, Bohm stone, silica, talc, mica, barium sulfate, lithopone, calcium carbonate, wollastonite, kaolin, brucite, diatomite, bentonite or pumice, or a mixture of at least two thereof, preferred to be any one of aluminum hydroxide, Bohm stone, silica, talc or mica, or a combination of two or more thereof.

14. The halogen-free flame retardant resin composition of claim 13, wherein the amount of the inorganic filler is 6-300 parts by weight.

15. The halogen-free flame retardant resin composition of claim 1, wherein the phosphorus content of the halogen-free flame retardant resin composition is 0.5-3 wt %, the nitrogen content is 1-10 wt %, and the halogen content is less than 0.09 wt %.

16. A prepreg comprising a base material and the halogen-free flame retardant resin composition of claim 1, wherein the halogen-free flame retardant resin composition is attached on the base material after impregnation and drying.

17. A laminate comprising at least one prepreg of claim 16.

18. The halogen-free flame retardant resin composition of claim 6, wherein the compound (A2) having a dihydrobenzoxazine ring is selected from a group consisting of phenolphthalein benzoxazine resin, 4,4'-diaminodiphenyl methane-type benzoxazine resin, or a combination of two or more thereof.

19. The halogen-free flame retardant resin composition of claim 7, wherein the epoxy resin is selected from a group consisting of a bisphenol-A epoxy resin with epoxy equivalent of 500-1500, 10-30 wt % of a carboxylated nitrile rubber-modified epoxy resin with epoxy equivalent of 700-2000, an oxazolidone ring containing halogen-free epoxy resin with epoxy equivalent of 600-1600, or a combination of two or more thereof.

20. The halogen-free flame retardant resin composition according to claim 8, wherein the phenolic resin is selected from a group consisting of a phenol novolac resin, a nitrogen-containing novolac resin, or combination of two or more thereof.

* * * * *

UNITED STATES PATENT AND TRADEMARK OFFICE
CERTIFICATE OF CORRECTION

PATENT NO. : 9,745,464 B2
APPLICATION NO. : 14/652065
DATED : August 29, 2017
INVENTOR(S) : Yueshan He and Shiguo Su Page 1 of 1

It is certified that error appears in the above-identified patent and that said Letters Patent is hereby corrected as shown below:

In the Claims

1. Column 25, Line 18 delete "1:15-1:5".

Signed and Sealed this
Fifth Day of December, 2017

Joseph Matal
*Performing the Functions and Duties of the*
*Under Secretary of Commerce for Intellectual Property and*
*Director of the United States Patent and Trademark Office*